(12) United States Patent
Wei et al.

(10) Patent No.: US 11,476,325 B2
(45) Date of Patent: Oct. 18, 2022

(54) SEMICONDUCTOR DEVICE

(71) Applicant: Jin Wei, Hong Kong (CN)

(72) Inventors: Jin Wei, Hong Kong (CN); Jing Chen, Hong Kong (CN)

(73) Assignee: Jin Wei, N.T. (HK)

( * ) Notice: Subject to any disclaimer, the term of this patent is extended or adjusted under 35 U.S.C. 154(b) by 0 days.

(21) Appl. No.: 16/746,881

(22) Filed: Jan. 19, 2020

(65) Prior Publication Data

US 2020/0321432 A1 Oct. 8, 2020

Related U.S. Application Data

(63) Continuation of application No. PCT/CN2019/093786, filed on Jun. 28, 2019.

(Continued)

(51) Int. Cl.
*H01L 29/06* (2006.01)
*H01L 21/8258* (2006.01)

(Continued)

(52) U.S. Cl.
CPC ...... *H01L 29/0626* (2013.01); *H01L 21/8258* (2013.01); *H01L 27/0727* (2013.01); *H01L 27/085* (2013.01); *H01L 27/0814* (2013.01); *H01L 29/1075* (2013.01); *H01L 29/267* (2013.01); *H01L 29/41766* (2013.01); *H01L 29/7787* (2013.01); *H01L 29/861* (2013.01);

(Continued)

(58) Field of Classification Search
CPC .......... H01L 29/0626; H01L 21/8258; H01L 27/0727; H01L 27/0814; H01L 27/085; H01L 29/1075; H01L 29/267; H01L 29/41766; H01L 29/7787; H01L 29/861; H01L 27/0605; H01L 29/205; H01L 27/0629; H01L 21/823481; H01L 29/7786; H01L 29/2003; H01L 29/66462; H01L 29/778; H01L 29/1087; H01L 29/66431; H01L 29/41725

See application file for complete search history.

(56) References Cited

U.S. PATENT DOCUMENTS 7,675,090 B2 * 3/2010 Sadaka ............. H01L 29/41766
257/194
7,838,907 B2 * 11/2010 Shiraishi ............. H01L 27/0688
257/195

(Continued)

FOREIGN PATENT DOCUMENTS

CN          1819255 A      8/2006
CN        103208509 A      7/2013

(Continued)

Primary Examiner — Shouxiang Hu

(57) ABSTRACT

A semiconductor apparatus includes a plurality of semiconductor devices with a single substrate, a plurality of trench regions, each trench region including a trench, wherein the single substrate includes a substrate layer, a first epitaxial layer of a first conductivity type, disposed on the substrate layer, and a second epitaxial layer of a second conductivity type, disposed on the first epitaxial layer, wherein each trench of the plurality of trench regions extends through the second epitaxial layer and into the first epitaxial layer, thereby isolating adjacent semiconductor devices of the plurality of semiconductor devices.

8 Claims, 5 Drawing Sheets

Related U.S. Application Data

(60) Provisional application No. 62/692,780, filed on Jun. 30, 2018.

(51) Int. Cl.
  *H01L 27/07* (2006.01)
  *H01L 27/08* (2006.01)
  *H01L 27/085* (2006.01)
  *H01L 29/10* (2006.01)
  *H01L 29/267* (2006.01)
  *H01L 29/417* (2006.01)
  *H01L 29/778* (2006.01)
  *H01L 29/861* (2006.01)
  *H01L 27/06* (2006.01)
  *H01L 29/205* (2006.01)

(52) U.S. Cl.
  CPC ........ *H01L 27/0605* (2013.01); *H01L 29/205* (2013.01)

(56) References Cited

U.S. PATENT DOCUMENTS

| | | | |
|---|---|---|---|
| 7,884,395 B2* | 2/2011 | Saito | H01L 29/404 257/199 |
| 8,698,196 B2* | 4/2014 | Guan | H01L 21/265 257/173 |
| 9,502,398 B2* | 11/2016 | Briere | H01L 23/5226 |
| 10,373,947 B2* | 8/2019 | Mallikarjunaswamy | H01L 29/866 |
| 2010/0197088 A1 | 8/2010 | Sakuma | |
| 2018/0076287 A1* | 3/2018 | Ohguro | H01L 29/2003 |

FOREIGN PATENT DOCUMENTS

| | | |
|---|---|---|
| CN | 203553172 A | 4/2014 |
| CN | 105226155 A | 1/2016 |
| CN | 106373991 A | 2/2017 |

\* cited by examiner

SEMICONDUCTOR DEVICE

CROSS-REFERENCE TO RELATED APPLICATION

This application claims the benefit of U.S. provisional application No. 62/692,780 filed on Jun. 30, 2018, titled "III-nitride power device and high-voltage integrated circuit platform based on the III-nitride power device". The entire disclosure of the above-referenced application is incorporated herein by reference in entirety for all purpose.

TECHNICAL FIELD

The present invention relates generally to semiconductor field, and more particularly to semiconductor devices, semiconductor apparatuses, and methods for manufacturing the same semiconductor apparatuses.

BACKGROUND

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Typically, III-nitride has a high bandgap that is suitable for high voltage power applications. According to a known design, a III-nitride semiconductor device may be manufactured by forming a III-nitride heterojunction over a silicon substrate. It is known in the art that the wide bandgap semiconductor GaN devices can be switched at a faster speed than traditional silicon-based semiconductor devices. This property can be exploited by application engineers to increase the operation frequency of the power systems, and thus reducing the volume and weight of the systems.

However, although the GaN devices are capable to operate at much higher frequency than silicon-based semiconductor devices, the switching frequency of a power system is sometimes limited by the parasitic inductance in the power loop. Those skilled in the art will recognize that when a semiconductor device is switched at a high speed, these parasitic inductances can generate high voltage spikes across the semiconductor devices, leading to device and system failures.

Generally, monolithic integration of semiconductor devices can significantly reduce the parasitic inductances. The lateral configuration of typical GaN devices are beneficial for monolithic integration of multiple devices. In power switching applications, such as a bridge circuit, there are high-side devices and low-side devices. To integrate the high-side GaN devices together with low-side GaN devices, however, there is a technical challenge related to the termination of the conductive substrate.

Generally, when a high-side GaN device and a low-side GaN device are monolithically integrated, the substrate can be connected to either the source of low side GaN device or the source of high-side GaN device. In both situations, the substrate induces a back-gating effect for the device whose source is not connected to the substrate. Furthermore, in power switching applications, the semiconductor devices are often required to have the capability to withstand the avalanche events. Traditional GaN devices have insufficient avalanche capability, so they cannot be adopted for some applications.

Other proposals have involved GaN and III nitride semiconductor devices. The problems with the semiconductor devices are that they do not overcome back gating and that they do not have sufficient capability to survive avalanche events. Also, these semiconductor devices do not overcome the parasitic inductance in the power loop. Even though the above cited GaN and III-nitride semiconductor devices meet some of the needs of the market, an integrated group III-nitride semiconductor device operable as a switch in the design and implementation of power conversion circuits, and that overcomes the insufficient avalanche capability, back gating, and parasitic inductance in the power loop, is still desired.

SUMMARY

One example embodiment provides a semiconductor device. The semiconductor device includes a substrate layer having a first face and a second face, a first epitaxial layer of a first conductivity type, disposed on the first face of the substrate layer, a second epitaxial layer of a second conductivity type, disposed on the first epitaxial layer, the second conductivity type being different from the first conductivity type, a transition layer disposed on the second epitaxial layer, a channel layer disposed on the transition layer, a barrier layer disposed on the channel layer; and a first electrode contacting the barrier layer and electrically connected to the second epitaxial layer.

Other example embodiments will be explained herein.

BRIEF DESCRIPTION OF THE DRAWINGS

The invention will now be described, by way of example, with reference to the accompanying drawings, in which.

DETAILED DESCRIPTION

Figure 1:
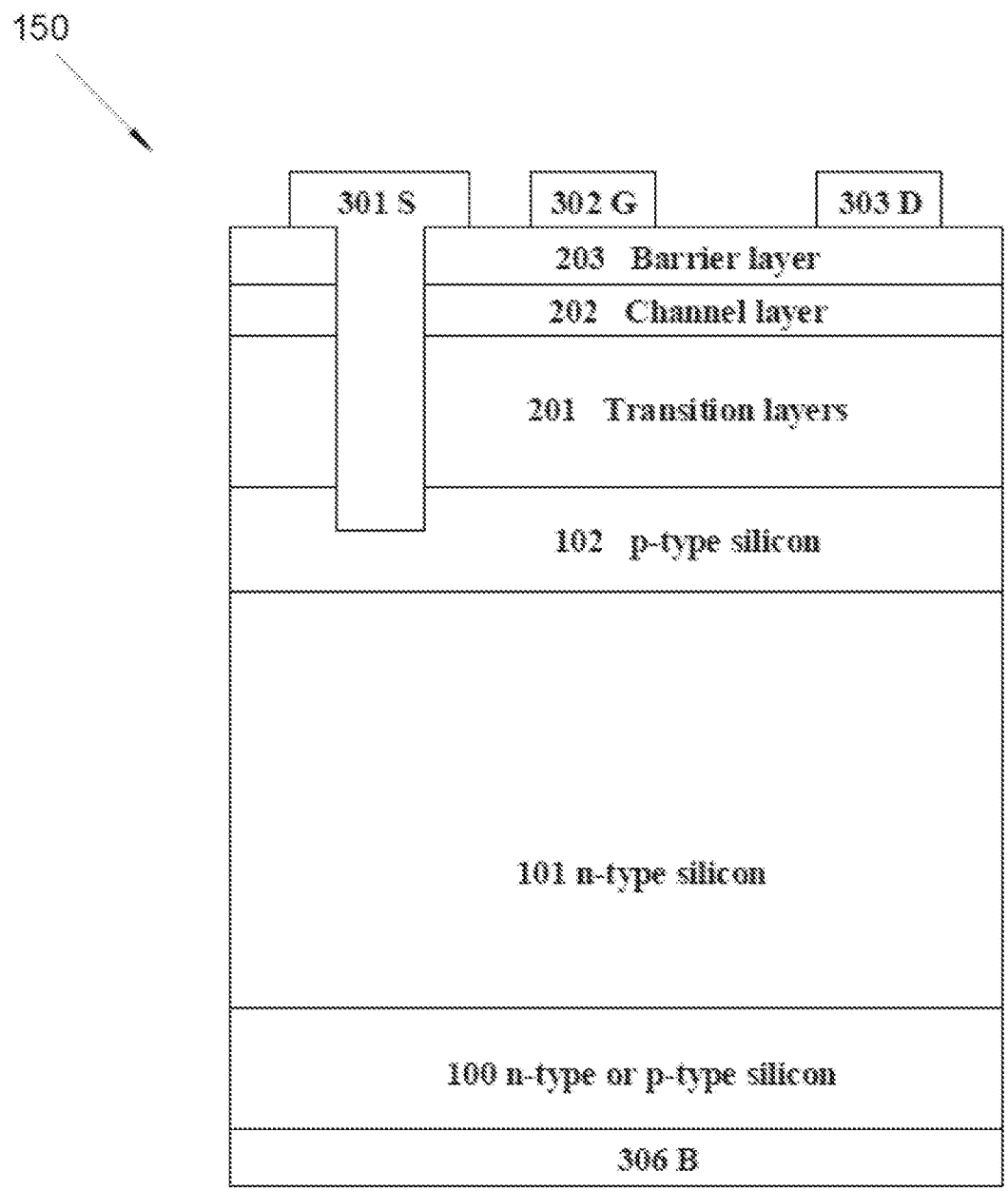
FIG. 1 illustrates a schematic structure of a semiconductor device according to the first embodiment.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Specific dimensions and other physical characteristics relating to the embodiments disclosed herein are therefore not to be considered as limiting, unless the claims expressly state otherwise.

One or more embodiments recognize one or more technical problems existing in conventional devices and methods. An III-nitride semiconductor device is efficacious for operating power semiconductor devices because the GaN is capable of carrying large currents and supporting high voltages. The semiconductor device also provides very low on-resistance and fast switching times. The semiconductor device is defined by multiple polarities of GaN, including Ga-polar, N-polar, semi-polar, and non-polar. The semiconductor device is monolithically integrated into various components to control the flow of electricity, for example, controlling LEDs. The semiconductor device also provides the switching power for power converters, power inverters, motor drives, and motor soft starters.

Multiple semiconductor devices can be monolithically integrated on a single substrate. It is known in the art that monolithic integration of semiconductor devices can significantly reduce the parasitic inductances. The lateral configuration of typical GaN devices are beneficial for monolithic integration of multiple devices. In power switching applications, such as a bridge circuit, there are high-side devices and low-side devices. To integrate the high-side GaN devices together with low-side GaN devices, however, there is a technical challenge related to the termination of the conductive substrate, which builds a back-gating effect for certain bias conditions. Furthermore, the prior GaN semiconductor device has an insufficient capability to survive avalanche events.

As referenced in the schematic diagram of FIG. 1, a semiconductor device 150 according to the first embodiment includes a substrate layer 100. The substrate layer 100 includes a conductive substrate, such as silicon. The substrate layer 100 includes a silicon substrate defined by an n-type dope or a p-type dope. Another layer used in the semiconductor device 150 includes a first epitaxy layer 101 that overlays the substrate layer 100. The first epitaxy layer 101 is defined by a first doping type, which may include an n-type doping. In one non-limiting embodiment, the first epitaxy layer 101 includes silicon.

A second epitaxy layer 102 also overlays the substrate layer 100. The second epitaxy layer 102 is defined by a second doping type, which may include a p-type doping. The second epitaxy layer 102 forms a junction with the first epitaxy layer 101, whereby a certain voltage can be sustained by the junction formed by the first epitaxy layer 101 and the second epitaxy layer 102. In one non-limiting embodiment, the second epitaxy layer 102 includes silicon.

The invented device further includes transition layers 201, a channel layer 202, a barrier layer 203, a source electrode 301, a gate electrode 302, a drain electrode 303, and a substrate contact 306. The transition layers 201 forms a junction with the second epitaxy layer 102. In some embodiments, the transition layers 201 includes at least one of the following: GaN, AlN, InN, AlGaN, InGaN, and AlInGaN. Yet another layer of the semiconductor device 150 is a channel layer 202 that forms a junction with the transition layers 201. The channel layer 202 is defined by a channel bandgap. In some embodiments, the channel layer 202 includes at least one of the following: GaN, AlN, InN, AlGaN, InGaN, and AlInGaN.

Continuing with FIG. 1, a barrier layer 203 forms a junction with the channel layer 202. The bandgap of the barrier layer 203 is larger than the bandgap of the channel layer 202. In some embodiments, the barrier layer 203 includes at least one of the following: GaN, AlN, InN, AlGaN, InGaN, and AlInGaN. In some embodiments, the semiconductor device 150 includes a source electrode 301. The source electrode 301 is electrically connected to the second epitaxy layer 102. There are multiple choices for the connection location between the source electrode 301 and the second epitaxy layer 102. For example, the connection can be directly under the source electrode 301, it can also be outside of the active region of the device. In application, such as a bridge circuit, the substrate contact 306 can be electrically connected to the drain of the high-side device. In application, such as a bridge circuit, the substrate contact 306 can also be electrically connected to the cathode of the high-side device. The substrate contact 306 can also be a floating contact.

In some embodiments, the semiconductor device 150 includes a gate electrode 302. In one embodiment, a recessed region is formed under the gate electrode 302. In another embodiment, a dielectric layer is formed under the gate electrode 302. In yet another embodiment, a p-type cap layer is formed under the gate electrode 302. In some embodiments, the semiconductor device 150 also includes a substrate contact 306. In one embodiment, the substrate contact 306 is electrically connected to the drain electrode 303. Thus, a vertical breakdown voltage is formed from the drain electrode 303 to the second epitaxy layer 102.

To provide the capability to survive from avalanche events, the breakdown voltage between the first epitaxy layer 101 and the second epitaxy layer 102 is lower than the lateral breakdown voltage between the drain electrode 303 and the source electrode 301. Additionally, the breakdown voltage between the first epitaxy layer 101 and the second epitaxy layer 102 is lower than the lateral breakdown voltage between the drain electrode 303 and the gate electrode 302. Furthermore, the breakdown voltage between the first epitaxy layer 101 and the second epitaxy layer 102 is lower than the vertical breakdown voltage between the drain electrode 303 and the second epitaxy layer 102. Consequently, when avalanche event occurs, the junction between the first epitaxy layer 101 and the second epitaxy layer 102 is can be used to pass the avalanche current.

Figure 2:
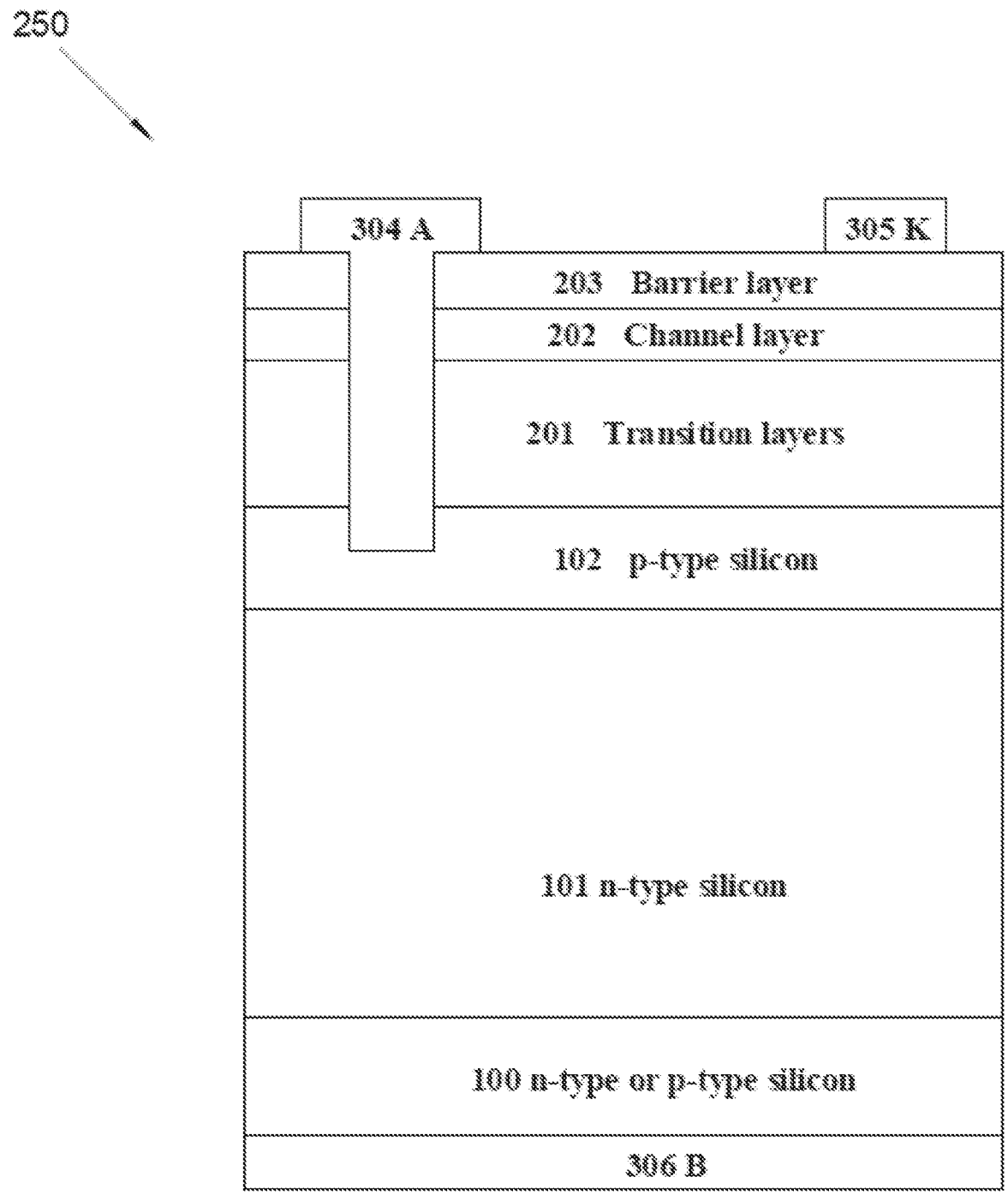
FIG. 2 illustrates a schematic structure of a semiconductor device according to the second embodiment.

Turning now to FIG. 2, a semiconductor device 250 according to another schematic embodiment includes many of the same layers, including the substrate layer 100, the first epitaxy layer 101, the second epitaxy layer 102, the transition layers 201, the channel layer 202, and the barrier layer 203. In addition, an anode electrode 304 is electrically connected to the second epitaxy layer 102. Additionally, a cathode electrode 305, and a substrate contact 306 are provided. As above, the transition layers 201 can include one or a combination of GaN, AlN, InN, AlGaN, InGaN, and AlInGaN. The channel layer 202 can be one or a combination of GaN, AlN, InN, AlGaN, InGaN, and AlInGaN. The barrier layer 203 can include one or a combination of GaN, AlN, InN, AlGaN, InGaN, and AlInGaN.

The semiconductor device 250 further comprises a substrate contact 306. In application, the substrate contact 306 is electrically connected to the cathode electrode 305. In application, such as a bridge circuit, the substrate contact 306 can be electrically connected to the drain of the high-side device. In application, such as a bridge circuit, the substrate contact 306 can also be electrically connected to the cathode of the high-side device. The substrate contact 306 can also be a floating contact. The junction between the first epitaxy layer 101 and the second epitaxy layer 102 is configured to have a lower breakdown voltage than the lateral breakdown voltage from the cathode electrode 305 to the anode electrode 304. In another voltage differential, a vertical breakdown voltage is formed from the cathode electrode 305 to the second epitaxy layer 102. Therefore, when avalanche event occurs, the junction between the first epitaxy layer 101 and the second epitaxy layer 102 can be used to pass the avalanche current.

In the second embodiment, the breakdown voltage between the first epitaxy layer 101 and the second epitaxy layer 102 is lower than the lateral breakdown voltage from the cathode electrode 305 to the anode electrode 304. In another embodiment, the breakdown voltage between the first epitaxy layer 101 and the second epitaxy layer 102 is lower than the vertical breakdown voltage from the cathode electrode 305 to the second epitaxy layer 102. In this manner, the junction between the first epitaxy layer 101 and the second epitaxy layer 102 can be used to pass an avalanche current.

In essence, a semiconductor apparatus according to an embodiment includes a plurality of semiconductor devices with a single substrate, a plurality of trench regions, and each trench region including a trench, wherein the single substrate includes a substrate layer, a first epitaxial layer of a first conductivity type, disposed on the substrate layer, and a second epitaxial layer of a second conductivity type, disposed on the first epitaxial layer, wherein each trench of the plurality of trench regions extends through the second epitaxial layer and into the first epitaxial layer, thereby isolating adjacent semiconductor devices of the plurality of semiconductor devices.

Figure 3:
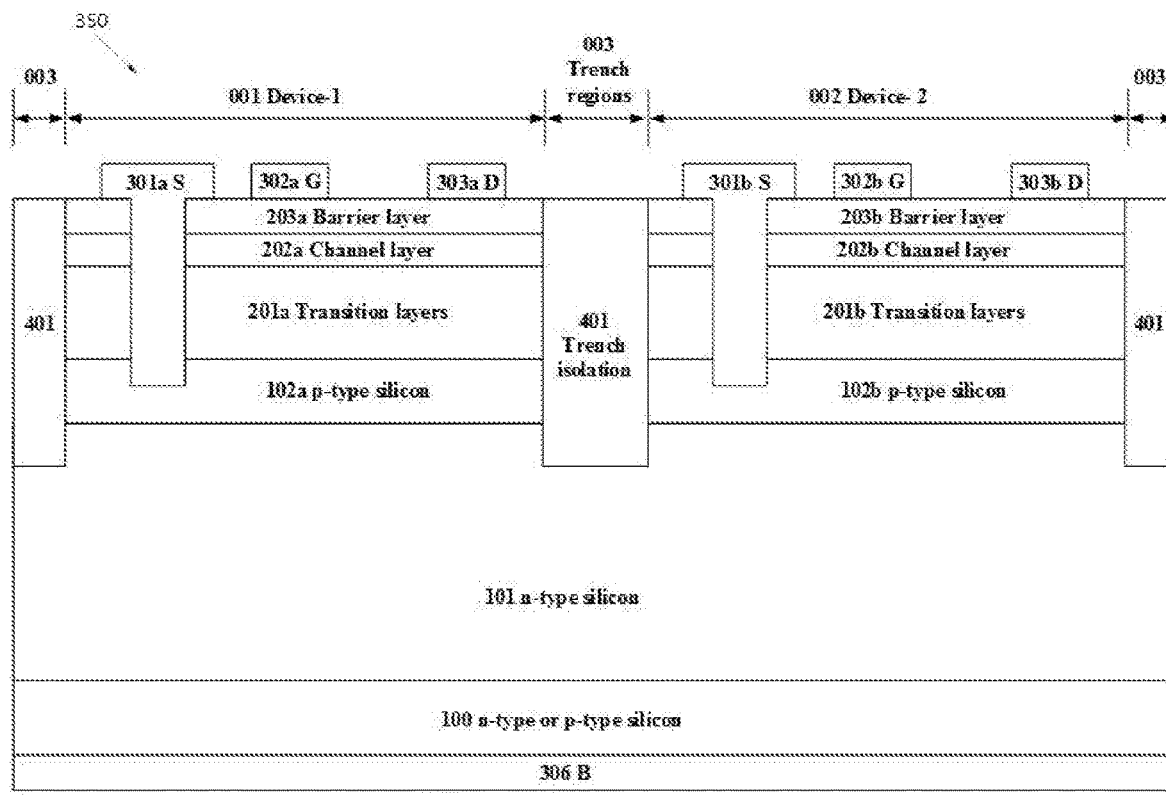
FIG. 3 illustrates a partial structure of a semiconductor apparatus according to an embodiment, where two transistors are separated by a trench.

FIG. 3 illustrates a partial structure of a semiconductor apparatus 350 according to an embodiment. This example embodiment consists of two integrated transistors, but in real practical there can be more than two devices integrated in one chip. The embodiment includes a single substrate. The single substrate includes a substrate 100, an epitaxy layer 101 with one doping type, a second epitaxy layer 102 with the doping type opposite to that of the epitaxy layer 101. The second epitaxy layer 102 is split into regions 102a and 102b by the trench 401. The initial substrate 100 can be a silicon substrate, and it can be doped to either n-type or p-type. The epitaxy layer 101 can be a silicon layer with n-type doping. The second epitaxy layer 102 can be a silicon layer with p-type doping. Device-1 001 includes transition layers 201a, a channel layer 202a, a barrier layer 203a, a source electrode 301a, a gate electrode 302a, and a drain electrode 303a. The transition layers 201a can include one or a combination of GaN, AlN, InN, AlGaN, InGaN, AlInGaN, etc. The channel layer 202a can be one or a combination of GaN, AlN, InN, AlGaN, InGaN, AlInGaN, etc. The barrier layer 203a can include one or a combination of GaN, AlN, InN, AlGaN, InGaN, AlInGaN, etc. At least one of the layers in the barrier layer 203a has a larger bandgap than the channel layer 202a. The source electrode 301a of Device-1 001 is electrically connected to the second epitaxy layer 102a. Device-2 002 includes transition layers 201b, a channel layer 202b, a barrier layer 203b, a source electrode 301b, a gate electrode 302b, and a drain electrode 303b. The transition layers 201b can include one or a combination of GaN, AlN, InN, AlGaN, InGaN, AlInGaN, etc. The channel layer 202b can be one or a combination of GaN, AlN, InN, AlGaN, InGaN AlInGaN, etc. The barrier layer 203b can include one or a combination of GaN, AlN, InN, AlGaN, InGaN, AlInGaN, etc. At least one of the layers in the barrier layer 203b has a larger bandgap than the channel layer 202b. The source electrode 301b of Device-2 is electrically connected to the second epitaxy layer 102b. Device-1 001 and Device-2 002 are separated by trench isolation region 003. The trench isolation region 003 includes a trench 401 which extends into the epitaxy layer 101. The trench 401 can be filled with insulating materials, such as $SiO_2$, $SiN_x$, $Al_2O_3$, etc. The trench 401 can also be filled with a combination of insulating materials, such as $SiO_2$, $SiN_x$, $Al_2O_3$, etc. and conductive materials, such as metal, polysilicon, etc., but there should be insulating material at least. The invented platform has a substrate contact 306. In application, such as a bridge circuit, the substrate contact 306 can be electrically connected to the drain of the high-side device or the cathode of the high-side device. The substrate contact 306 can also be a floating contact. According to the invented high-voltage integrated circuit platform the devices in the platform are isolated to each other, so the back-gating issue is avoided. Furthermore, the junction between the epitaxy layer 101 and the epitaxy layer 102 provides the capability to pass an avalanche current.

Figure 4:
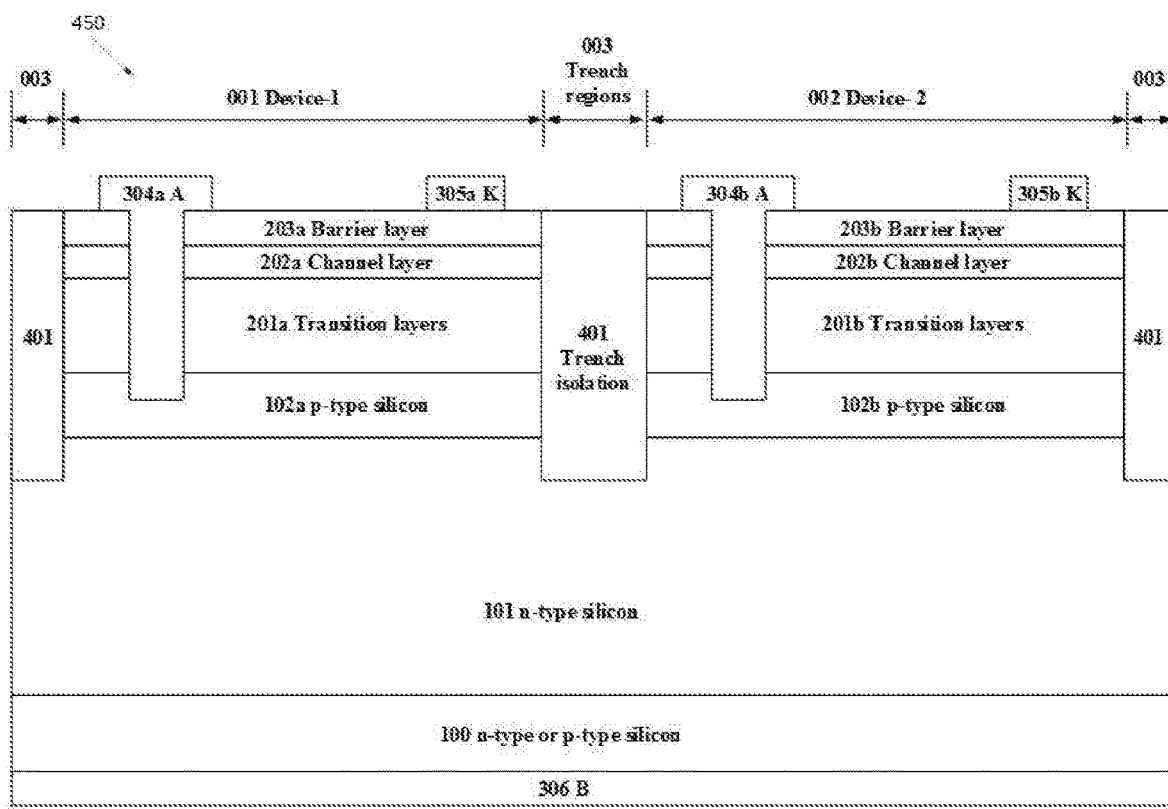
FIG. 4 illustrates a partial structure of a semiconductor apparatus according to an embodiment, where two diodes are separated by a trench.

FIG. 4 illustrates a partial structure of a semiconductor apparatus 450 according to another embodiment, where two diodes are separated by a trench. This example embodiment consists of two integrated diodes, but in real practical there can be more than two devices integrated in one chip. The embodiment includes a single substrate. The single substrate includes a substrate layer 100, an epitaxy layer 101 with one doping type, a second epitaxy layer 102 with the doping type opposite to that of the epitaxy layer 101. The second epitaxy layer 102 is split into regions 102a and 102b by the trench 401. The initial substrate 100 can be a silicon substrate, and it can be doped to either n-type or p-type. The epitaxy layer 101 can be a silicon layer with n-type doping. The second epitaxy layer 102 can be a silicon layer with p-type doping. Device-1 001 includes transition layers 201a, a channel layer 202a, a barrier layer 203a, an anode electrode 304a, and a cathode electrode 305a. The transition layers 201a can include one or a combination of GaN, AlN, InN, AlGaN, InGaN, AlInGaN, etc. The channel layer 202a can be one or a combination of GaN, AlN, InN, AlGaN, InGaN, AlInGaN, etc. The barrier layer 203a can include one or a combination of GaN, AlN, InN, AlGaN, InGaN, AlInGaN, etc. At least one of the layers in the barrier layer 203a has a larger bandgap than the channel layer 202a. The anode electrode 304a of Device-1 001 is electrically connected to the second epitaxy layer 102a. Device-2 002 includes transition layers 201b, a channel layer 202b, a barrier layer 203b, an anode electrode 304b, and a cathode electrode 305b. The transition layers 201b can include one or a combination of GaN, AlN, InN, AlGaN, InGaN, AlInGaN, etc. The channel layer 202b can be one or a combination of GaN, AlN, InN, AlGaN, InGaN, AlInGaN, etc. The barrier layer 203b can include one or a combination of GaN, AlN, InN, AlGaN, InGaN, AlInGaN, etc. At least one of the layers in the barrier layer 203b has a larger bandgap than the channel layer 202b. The anode electrode 304b of Device-2 002 is electrically connected to the second epitaxy layer 102b. Device-1 001 and Device-2 002 are separated by trench isolation region 003.

The trench isolation region 003 includes a trench 401, which extends into the epitaxy layer 101. The trench 401 can be filled with insulating materials, such as $SiO_2$, $SiN_x$, $Al_2O_3$, etc. The trench 401 can also be filled with a combination of insulating materials, such as $SiO_2$, $SiN_x$, $Al_2O_3$, etc. and conductive materials, such as metal, polysilicon, etc., but there should be insulating material at least. The invented platform has a substrate contact 306. In application, such as a bridge circuit, the substrate contact 306 can be electrically connected to the cathode of the high-side device or drain of the high-side device. The substrate contact 306 can also be a floating contact. According to the invented high-voltage integrated circuit platform, the devices in the platform are isolated to each other, so the back-gating issue is avoided. Furthermore, the junction between the epitaxy layer 101 and the epitaxy layer 102 provides the capability to pass an avalanche current.

Figure 5:
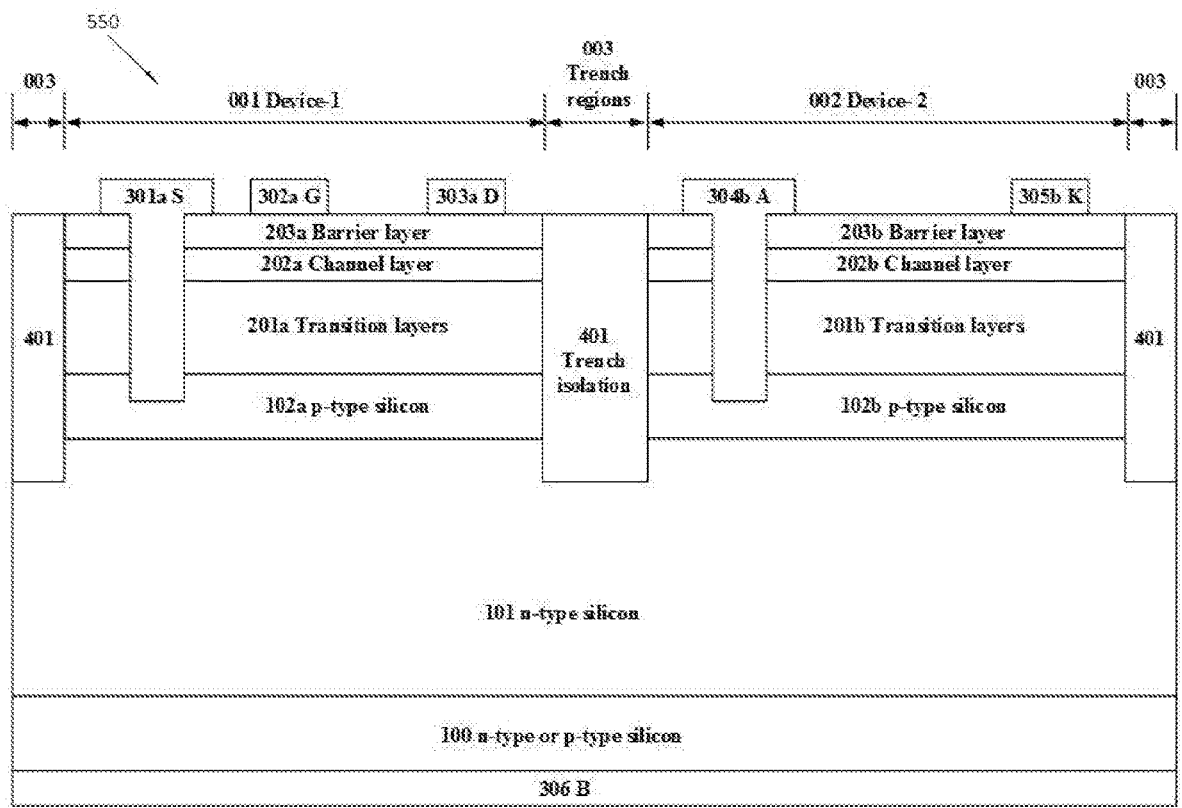
FIG. 5 illustrates a partial structure of a semiconductor apparatus according to an embodiment, where a transistor and a diode are separated by a trench; and Like reference numerals refer to like parts throughout the various views of the drawings.

FIG. 5 illustrates a partial structure of a semiconductor apparatus 550 according to another embodiment, where a transistor and a diode are separated by a trench. This example embodiment consists of one transistor and one diode, but in real practice there can be more than two devices integrated in one chip. The platform includes a substrate. The substrate includes an initial substrate 100, an epitaxy layer 101 with one doping type, a second epitaxy layer 102 with the doping type opposite to that of the epitaxy layer 101. The second epitaxy layer 102 is split into regions 102a and 102b by the trench 401. The initial substrate 100 can be a silicon substrate, and it can be doped to either n-type or p-type. The epitaxy layer 101 can be a silicon layer with n-type doping. The second epitaxy layer 102 can be a silicon layer with p-type doping. Device-1 001 includes transition layers 201a, a channel layer 202a, a barrier layer 203a, a source electrode 301a, a gate electrode 302a, and a drain electrode 303a. The transition layers 201a can include one or a combination of GaN, AlN, InN, AlGaN, InGaN, AlInGaN, etc. The channel layer 202a can be one or a combination of GaN, AlN, InN, AlGaN, InGaN, AlInGaN, etc. The barrier layer 203a can include one or a combination of GaN, AlN, InN, AlGaN, InGaN, AlInGaN, etc. At least one of the layers in the barrier layer 203a has a larger bandgap than the channel layer 202a. The source electrode 301a of Device-1 001 is electrically connected to the second epitaxy layer 102a. Device-2 002 includes transition layers 201b, a channel layer 202b, a barrier layer 203b, an anode electrode 304b, and a cathode electrode 305b. The transition layers 201b can include one or a combination of GaN, AlN, InN, AlGaN, InGaN, AlInGaN, etc. The channel layer 202b can be one or a combination of GaN, AlN, InN, AlGaN, InGaN, AlInGaN, etc. The barrier layer 203b can include one or a combination of GaN, AlN, InN, AlGaN, InGaN, AlInGaN, etc. At least one of the layers in the barrier layer 203b has a larger bandgap than the channel layer 202b. The anode electrode 304b of Device-2 002 is electrically connected to the second epitaxy layer 102b. Device-1 001 and Device-2 002 are separated by trench isolation region 003. The trench isolation region 003 includes a trench 401, which extends into the epitaxy layer 101. The trench 401 can be filled with insulating materials, such as $SiO_2$, $SiN_x$, $Al_2O_3$, etc. The trench 401 can also be filled with a combination of insulating materials, such as $SiO_2$, $SiN_x$, $Al_2O_3$, etc. and conductive materials, such as metal, polysilicon, etc., but there should be insulating material at least. The invented platform has a substrate contact 306. In application, such as a bridge circuit, the substrate contact 306 can be electrically connected to the drain or cathode of the high-side device. The substrate contact 306 can also be a floating contact. According to the invented high-voltage integrated circuit platform, the devices in the platform are isolated to each other, so the back-gating issue is avoided. Furthermore, the junction between the epitaxy layer 101 and the epitaxy layer 102 provides the capability to pass an avalanche current.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. A semiconductor apparatus, comprising:
a plurality of semiconductor devices with a single substrate; and
a plurality of trench regions, each trench region including a trench,
wherein the single substrate comprises a substrate layer, a first epitaxial layer of a first conductivity type, disposed on the substrate layer, and a second epitaxial layer of a second conductivity type, disposed on the first epitaxial layer,
wherein each trench of the plurality of trench regions extends through the second epitaxial layer and into the first epitaxial layer, thereby isolating adjacent semiconductor devices of the plurality of semiconductor devices;
wherein each of the plurality of semiconductor devices comprises:
a transition layer disposed on the second epitaxial layer;
a channel layer disposed on the transition layer;
a barrier layer disposed on the channel layer and comprising material with bandgap larger than bandgap of the channel layer; and
a first electrode contacting the barrier layer and electrically connected to the second epitaxial layer;
a second electrode disposed on the barrier layer;
wherein the transition layer, the channel layer and the barrier layer all comprise nitrides.

2. The semiconductor apparatus of claim 1, wherein the plurality of semiconductor devices are selected from a group consisting of diodes and/or transistors.

3. The semiconductor apparatus of claim 1, wherein each trench of the plurality of trench regions is filled with insulating materials.

4. The semiconductor apparatus of claim 3, wherein the insulating materials are selected from a group consisting of $SiO_2$, $SiN_x$, $HfO_2$, and/or $Al_2O_3$.

5. The semiconductor apparatus of claim 3, wherein each trench is further filled with conductive materials.

6. The semiconductor apparatus of claim 1, wherein the transition layer comprises one or more materials selected from a group consisting of GaN, AlN, InN, AlGaN, InGaN, and AlInGaN.

7. The semiconductor apparatus of claim 1, wherein the channel layer comprises one or more materials selected from a group consisting of GaN, AlN, InN, AlGaN, InGaN, and AlInGaN.

8. The semiconductor apparatus of claim 1, wherein the barrier layer comprises one or more materials selected from a group consisting of GaN, AlN, InN, AlGaN, InGaN, and AlInGaN.

* * * * *